US010229926B2

(12) United States Patent
Yu et al.

(10) Patent No.: US 10,229,926 B2
(45) Date of Patent: Mar. 12, 2019

(54) FLASH MEMORY DEVICE AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Guobin Yu, Shanghai (CN); Xiaoping Xu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/926,791

(22) Filed: Mar. 20, 2018

(65) Prior Publication Data
US 2018/0277557 A1     Sep. 27, 2018

(30) Foreign Application Priority Data

Mar. 22, 2017 (CN) .......................... 2017 1 0172130

(51) Int. Cl.
*H01L 27/115* (2017.01)
*H01L 27/11568* (2017.01)
(Continued)

(52) U.S. Cl.
CPC .. *H01L 27/11568* (2013.01); *H01L 21/28282* (2013.01); *H01L 21/8239* (2013.01); *H01L 27/115* (2013.01)

(58) Field of Classification Search
CPC .......................... H01L 21/8239; H01L 27/115
(Continued)

(56) References Cited

U.S. PATENT DOCUMENTS 9,490,349 B1 * 11/2016 Yang ................. H01L 29/66825
2005/0079696 A1 * 4/2005 Colombo .......... H01L 21/28088
438/595

(Continued)

*Primary Examiner* — George Fourson, III
(74) *Attorney, Agent, or Firm* — Kilpatrick Townsend & Stockton LLP

(57) ABSTRACT

A method for manufacturing a flash memory device includes providing a substrate structure including a substrate, an insulating layer on the substrate, and a stack structure including a charge storage layer, a tunneling dielectric layer, a charge trapping layer, a blocking dielectric layer and a gate layer disposed sequentially from bottom to top on the insulating layer. The method also includes performing a selective nitriding process on the substrate structure to form a nitride layer exposed surfaces of the charge storage layer and the gate layer, and forming an isolation region on side surfaces of the stack structure. The method can mitigate the problem of an undesirable increase in the threshold voltage with an increase in the integration density of the flash memory device.

15 Claims, 3 Drawing Sheets

(51) Int. Cl.
*H01L 21/28* (2006.01)
*H01L 21/8239* (2006.01)

(58) Field of Classification Search
USPC .......................................... 257/321; 438/257
See application file for complete search history.

(56) References Cited

U.S. PATENT DOCUMENTS

| | | | | |
|---|---|---|---|---|
| 2005/0110057 | A1* | 5/2005 | Wang | H01L 21/28273 257/288 |
| 2005/0258491 | A1* | 11/2005 | Bojarczuk, Jr. | H01L 21/28202 257/369 |
| 2005/0269634 | A1* | 12/2005 | Bojarczuk, Jr. | H01L 21/28079 257/338 |
| 2006/0237796 | A1* | 10/2006 | Cartier | H01L 21/82384 257/371 |
| 2006/0240623 | A1* | 10/2006 | Lee | B82Y 10/00 438/257 |
| 2008/0191292 | A1* | 8/2008 | Callegari | H01L 21/28088 257/411 |
| 2008/0203481 | A1* | 8/2008 | Akahori | H01L 27/115 257/365 |
| 2008/0286919 | A1* | 11/2008 | Goda | H01L 21/76229 438/211 |
| 2008/0296656 | A1* | 12/2008 | Ozawa | H01L 21/28273 257/321 |
| 2009/0212349 | A1* | 8/2009 | Kai | B82Y 10/00 257/324 |
| 2010/0102377 | A1* | 4/2010 | Iikawa | H01L 21/76224 257/324 |
| 2010/0163968 | A1* | 7/2010 | Kim | H01L 27/11565 257/324 |
| 2010/0270608 | A1* | 10/2010 | Pham | H01L 21/2815 257/324 |

* cited by examiner

FLASH MEMORY DEVICE AND MANUFACTURING METHOD THEREOF

CROSS-REFERENCES TO RELATED APPLICATIONS

The present application claims priority to Chinese patent application No. 201710172130.7, filed with the State Intellectual Property Office of People's Republic of China on Mar. 22, 2017, the content of which is incorporated herein by reference in its entirety.

FIELD OF THE INVENTION

The present disclosure relates to semiconductor technology, and more particularly to a flash memory device and manufacturing method of the same.

BACKGROUND OF THE INVENTION

Flash memory devices may be broadly classified into two groups: One is a NOR-type flash memory device and the other is a NAND-type flash memory device. Compared with NAND-type flash memory device, a NOR-type flash memory device has better read data performance and supports execute-in-place (XIP) applications to execute programs directly. Therefore, a NOR-type flash memory is widely used in embedded systems to store program data and execute program codes.

However, the inventors have discovered that the threshold voltage of a NOR or NAND flash memory device undesirably increases with an increase in the integration density of the flash memory device due to the oxygen smiling effect, thereby adversely affecting the performance of the flash memory device.

BRIEF SUMMARY OF THE INVENTION

The present inventors have solved this problem by providing a novel solution that reduces or eliminates an undesirable increase of the threshold voltage of a flash memory device with the integration density increase of the flash memory device.

Embodiments of the present invention, in one aspect, provide a method for manufacturing a flash memory device. The method may include providing a substrate structure including a substrate, an insulating layer on the substrate, and a stack structure including a charge storage layer, a tunneling dielectric layer, a charge trapping layer, a blocking dielectric layer and a gate layer disposed sequentially from bottom to top on the insulating layer, performing a selective nitriding process on the substrate structure to form a nitride layer exposed surfaces of the charge storage layer and the gate layer, and forming an isolation region on side surfaces of the stack structure.

In one embodiment, performing the selective nitriding process includes an energy of nitrogen in a range between 1.5 eV and 3.0 eV. In one embodiment, the energy of nitrogen is in a range between 1.5 eV and 2.0 eV.

In one embodiment, performing the selective nitriding process includes a nitrogen dose in a range between $1 \times 10^{15}$ atoms/cm$^2$ and $1 \times 10^{16}$ atoms/cm$^2$. In one embodiment, performing the selective nitriding process includes a pressure in a range between 0.1 torr and 10 torr.

In one embodiment, forming the isolation region includes forming a repair oxide layer on the side surfaces of the stack structure, and forming an isolation material layer on the repair oxide layer.

In one embodiment, the method further includes, prior to forming the isolation material layer on the repair oxide layer, forming a barrier oxide layer on the repair oxide layer, and the isolation material layer is formed on the barrier oxide layer.

In one embodiment, forming the repair oxide layer includes a rapid thermal oxidation process. In one embodiment, forming the isolation material layer includes a rapid thermal oxidation process, a furnace oxidation process, a chemical vapor deposition process, or an atomic layer deposition process.

In one embodiment, providing the substrate structure includes providing the substrate; forming the insulating layer on the substrate; forming the charge storage layer on the insulating layer; forming the tunneling dielectric layer on the charge storage layer; forming the charge trapping layer on the tunneling dielectric layer; forming the blocking dielectric layer on the charge trapping layer; and forming the gate layer on the blocking dielectric layer.

Embodiments of the present invention also provide a flash memory device. The flash memory device includes a substrate, an insulating layer on the substrate, a stack structure including a charge storage layer, a tunneling dielectric layer, a charge trapping layer, a blocking dielectric layer and a gate layer disposed sequentially from bottom to top on the insulating layer, an isolation region on side surfaces of the stack structure, and a nitride layer disposed between a portion of the isolation region and the charge storage layer and between a portion of the isolation region and the gate layer.

In one embodiment, the isolation region includes a repair oxide layer on a side surface of the stack structure, and an insulating material layer on the repair oxide layer.

In one embodiment, the isolation region further includes a barrier oxide layer between the repair oxide layer and the insulating material layer.

In one embodiment, the tunneling dielectric layer comprises silicon oxide; the charge trapping layer comprises silicon nitride; or the blocking dielectric layer comprises silicon oxide; or the charge storage layer and the gate layer each comprise polysilicon.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
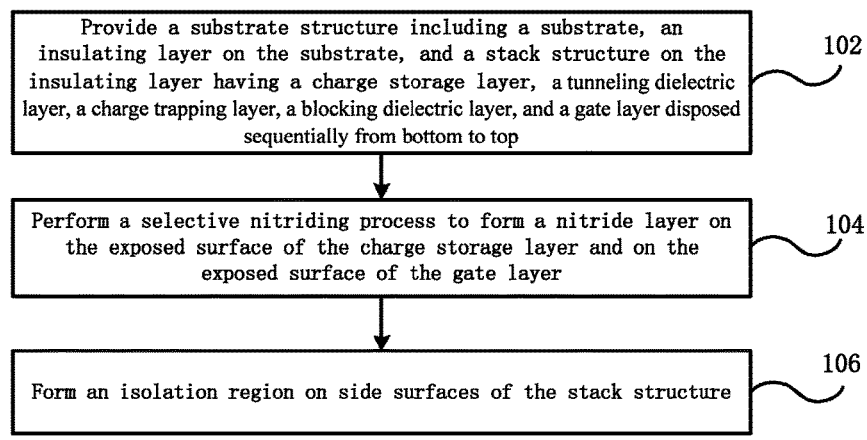
FIG. 1 is a simplified flowchart illustrating a method of manufacturing a flash memory device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

The present inventors have intensively studied the problems related to an undesirable increase of the threshold voltage of a flash memory with an increase in the integration density of the flash memory device. The present inventors have discovered that, when forming an isolation region for isolating different flash memory devices, the dielectric layer in the flash memory device, e.g., the oxide layer-nitride layer-oxide layer (ONO) structure, regrows; for example, the oxide layer on the gate layer is oxidized so that the thickness of the oxide layer at both end portions is larger than the thickness of the oxide layer in the middle portion, resulting in an increase in the threshold voltage of the device and adversely affecting the performance of the device. Accordingly, the present inventors proposed the following solutions.

FIG. 1 is a simplified flowchart illustrating a method of manufacturing a flash memory device according to an embodiment of the present invention. Referring to FIG. 1, the manufacturing method may include:

At 102, providing a substrate structure. The substrate structure includes a substrate, an insulating layer on the substrate, and a stack structure on the insulating layer. The stack structure includes, sequentially from bottom to top, a charge storage layer, a tunneling dielectric layer, a charge trapping layer, a blocking dielectric layer, and a gate layer.

At 104: performing a selective nitriding process to form a nitride layer on the exposed surface of the charge storage layer and on the exposed surface of the gate layer.

At 106: forming an isolation region on side surfaces of the stack structure.

In the embodiment, a selective nitriding process is performed prior to forming the isolation region to form a nitride layer on the exposed surface of the charge storage layer and on the exposed surface of the gate layer so that the exposed surface of the charge storage layer and the exposed surface of the gate layer will not be reoxidized when the isolation region is formed, so that the thicknesses of both end portions of the tunneling dielectric layer and the blocking dielectric layer will not increase to improve the stability of the threshold voltage and performance of the flash memory device.

A manufacturing method of a flash memory device according to an embodiment of the present invention will be described in detail with reference to FIGS. 2A to 2E.

Figure 2A:
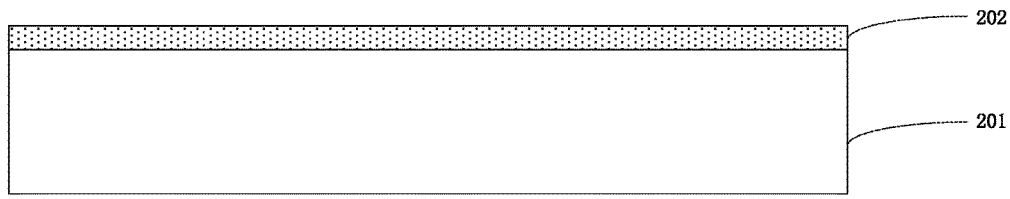
FIGS. 2A to 2E are cross-sectional views illustrating intermediate stages of a semiconductor device in the manufacturing method according to an embodiment of the present invention.

FIG. 2A is a cross-sectional view illustrating a substrate 201 in the manufacturing method according to an embodiment of the present invention. Referring to FIG. 2A, a substrate 201 including an insulating layer 202 is provided.

Substrate 201 may be a silicon substrate or a semiconductor substrate. Insulating layer 202 may be a silicon oxide layer.

Figure 2B:
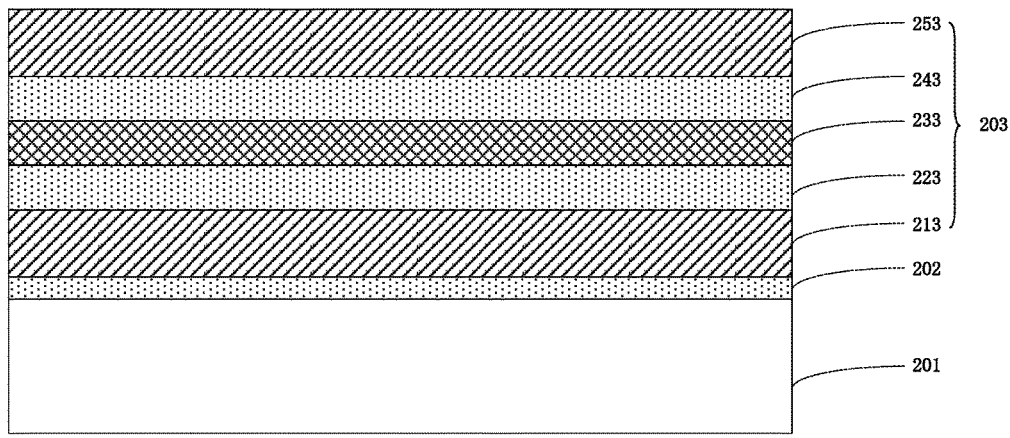

Referring to FIG. 2B, a stack layer 203 is formed on insulating layer 202. Stack layer 203 includes, sequentially from bottom to top, a charge storage layer 213, a tunneling dielectric layer 223, a charge trapping layer 233, a blocking dielectric layer 243, and a gate material layer 253.

In one exemplary embodiment, charge storage layer 213 may include polysilicon, tunneling dielectric layer 223 may include silicon oxide, charge trapping layer 233 may include silicon nitride, blocking dielectric layer 243 may include silicon oxide, and gate material layer 253 may include polysilicon. Of course, the present invention is not limited thereto.

Figure 2C:
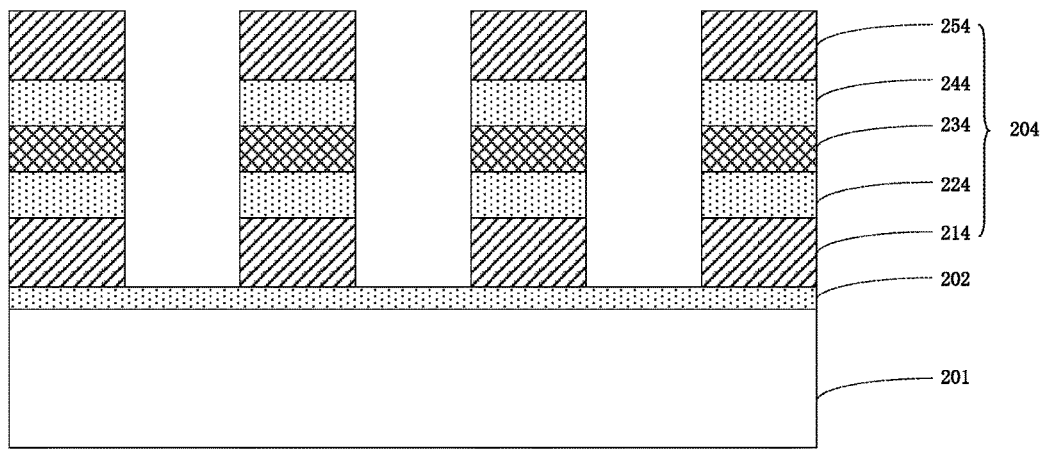

Referring to FIG. 2C, stack layer 203 is patterned to form one or more stack structures 204, the one or more stack structures include, sequentially from bottom to top, a charge storage layer 214, a tunneling dielectric layer 224, a charge trapping layer 234, a blocking dielectric layer 244, and a gate layer 254.

In one exemplary embodiment, a patterned mask layer may be formed on stack layer 203, and an etching process is performing on stack layer 203 using the patterned mask layer as a mask to form one or more stack structures 204. Charge storage layer 214 may include polysilicon, tunneling dielectric layer 224 may include silicon oxide, charge trapping layer 234 may include silicon nitride, blocking dielectric layer 244 may include silicon oxide, and gate layer 254 may include polysilicon.

Figure 2D:
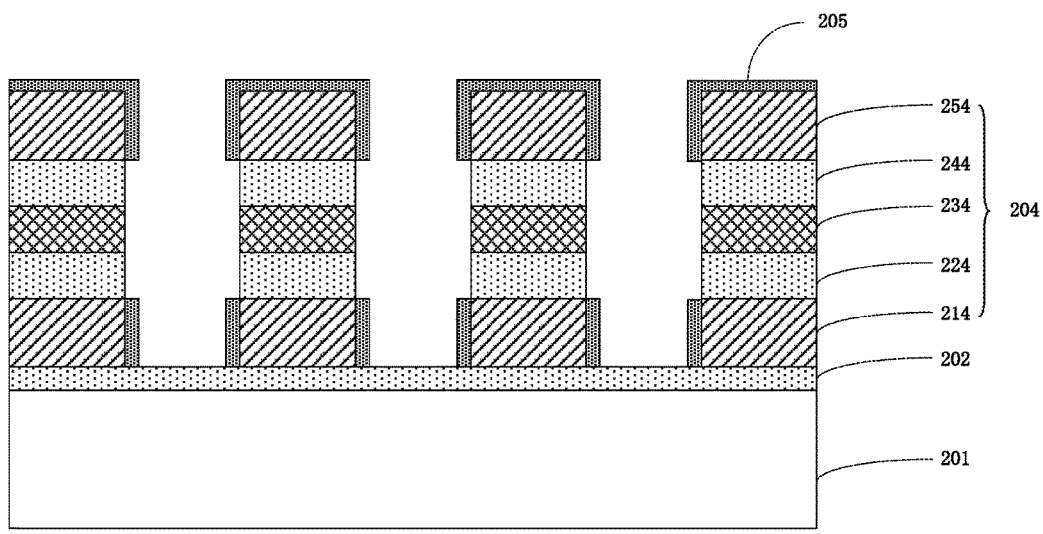

Referring to FIG. 2D, a selective nitriding process is performed on the one or more stack structures to form a nitride layer 205 on the exposed surface of charge storage layer 214 and on the exposed surface of gate layer 254 without forming a nitride layer on the exposed surfaces of tunneling dielectric layer 224, charge trapping layer 234, and blocking dielectric layer 244.

In one embodiment, the selective nitriding process may include a nitrogen energy in the range between 1.5 eV and 3.0 eV (e.g., 1.8 eV, 2.0 eV, 2.5 eV, 2.8 eV), and preferably in the range between 1.5 eV and 2.0 eV (e.g., 1.6 eV or 1.7 eV). By selecting the appropriate nitrogen energy, nitride layer 205 can be formed only on the exposed surfaces of charge storage layer 214 and gate layer 254 as much as possible without forming a nitride layer on the exposed surfaces of tunneling dielectric layer 224, charge trapping layer 234, and blocking dielectric layer 244.

In one embodiment, charge storage layer 214 and gate layer 254 each include polysilicon, tunneling dielectric layer 224 and blocking dielectric layer 244 each include silicon dioxide, the bond energy of polysilicon with nitrogen is less than the bond energy of silicon dioxide and nitrogen. Thus, the energy of nitrogen can be controlled to be less than a certain value, for example 2.5 eV, so that only the exposed surface of charge storage layer 214 and the exposed surface of gate layer 254 are nitrided by the nitriding process.

In order to better satisfy the requirements of the selective nitriding process, the selective nitriding process may be performed at a pressure in the range between 0.1 torr and 10 torr (e.g., 2 torr, 4 torr, 6 torr, 9 torr). In the case where the energy of nitrogen is in the range between 1.5 eV and 3.0 eV and the pressure in the selective nitriding process is in the range between 0.1 torr and 10 torr, the effect of the selective nitriding process is more pronounced. That is, it is possible to ensure that nitride layer 206 is formed only on the exposed surface of charge storage layer 214 and on the exposed surface of gate layer 254.

The inventors have found that a better selectivity effect can be obtained by considering the energy, pressure, and nitrogen dose in the selective nitriding process. In one specific embodiment, the nitrogen dose in the selective nitriding process may be in the range between $1 \times 10^{15}$ atoms/cm$^2$ and $1 \times 10^{16}$ atoms/cm$^2$ (e.g., $1.3 \times 10^{15}$ atoms/cm$^2$, $1.5 \times 10^{15}$ atoms/cm$^2$, $1.8 \times 10^{15}$ atoms/cm$^2$).

Figure 2E:
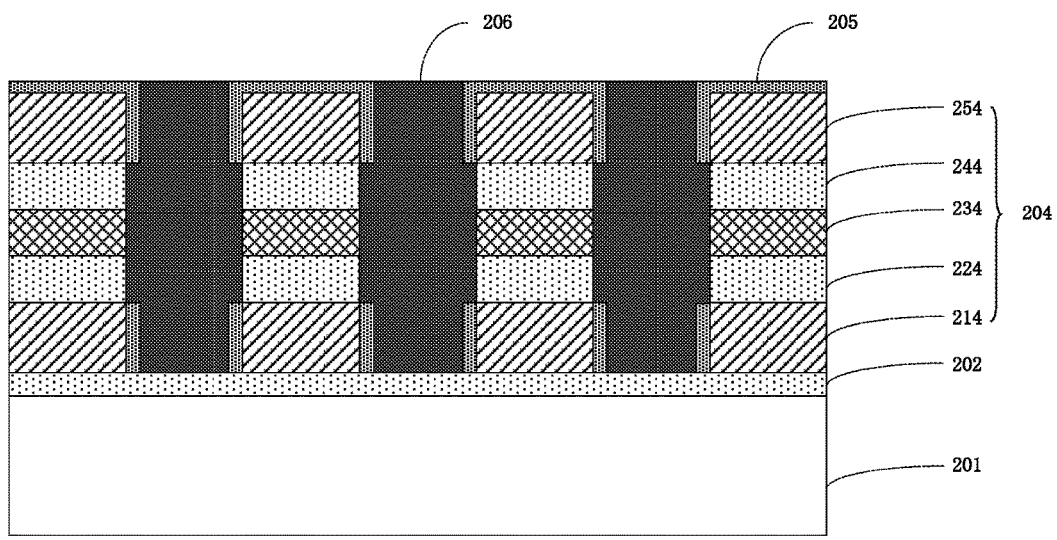

Referring to FIG. 2E, an isolation region 206 is formed on side surfaces of the stack structure.

In one embodiment, isolation region 206 may be formed by the following steps:

A repair oxide layer (not shown) is formed on the side surfaces of stack structure 204 to repair damage caused by the etching process of the stack layer. In one embodiment, the repair oxide layer may be formed using a rapid thermal oxidation (RTO) process.

Thereafter, an insulating material layer is formed on the repair oxide layer. For example, the insulating material layer may be formed using a rapid thermal oxidation (RTO) process, a furnace oxidation process, a chemical vapor deposition (CVD) process or an atomic layer deposition (ALD) process. The insulating material layer may be a silicon oxide. The insulating material layer may be formed at a temperature in the range between 600 degrees Celsius and 1000 degrees Celsius (e.g., 800° C., 900° C.).

In one embodiment, a barrier oxide layer may also be deposited on the surface of the repair oxide layer prior to forming the insulating material layer on the repair oxide layer to reduce the diffusion of the repair oxide layer. In this case, the insulating material layer is formed on the barrier oxide layer.

Thereafter, a conventional process of manufacturing a flash memory device can be carried out. Since the conventional process of manufacturing a flash memory device is not the focus of the invention, the detail description thereof will be omitted for the sake of brevity.

Figure 3:
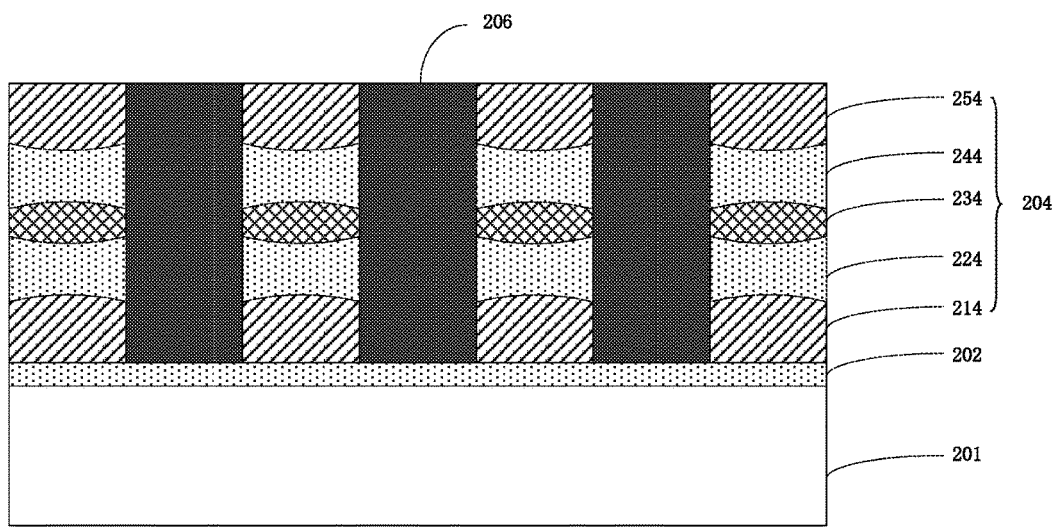
FIG. 3 is a cross-sectional view illustrating an example of a flash memory device that does not undergo a selective nitriding process.

FIG. 3 is a cross-sectional view illustrating an example of a flash memory device that did not undergo a selective nitriding process. As shown in FIG. 3, in forming isolation region 206, e.g., an oxide is formed by oxidation as isolation layer 206, charge storage layer 214 and gate layer 254 are oxidized so that the thicknesses of both tunneling dielectric layer 224 and blocking dielectric layer 244 increase generating a smiling effect, so that the flash memory device threshold voltage increases, adversely affecting the flash memory device performance.

As described above, according to the manufacturing method of a flash memory device according to the embodiment of the present invention, since the selective nitriding process is introduced so that the thicknesses of both the tunneling dielectric layer and the blocking dielectric layer do not increase, the threshold voltage of the flash memory device is more stable, and the device performance is improved.

The method for manufacturing a flash memory device of the present invention is suitable for, but not limited to, NAND and NOR flash memory devices.

Embodiments of the present invention also provide a flash memory device. Referring to FIG. 2E, the flash memory device includes a substrate 201, an insulating layer 202 on substrate 201, one or more stack structures 204 on insulating layer 202. The one or more stack structures include, sequentially from bottom to top, a charge storage layer 214, a tunneling dielectric layer 224, a charge trapping layer 234, a blocking dielectric layer 244, and a gate layer 254.

The flash memory device further includes an isolation region 206 on side surfaces of stack structure 204. Isolation region 206 is disposed on side surfaces of the stack structure, and a nitride layer 205 is disposed between isolation region 206 and charge storage layer 214 and between isolation region 206 and gate layer 254.

In one embodiment, isolation region 206 may include a repair oxide layer (not shown) on side surfaces of stack structure 204 and an isolation material layer (not shown). In one specific embodiment, isolation layer 206 also includes a barrier oxide layer between the repair oxide layer and the insulating material layer.

In one embodiment, tunneling dielectric layer 224 may include silicon oxide, charge trapping layer 234 may include silicon nitride, blocking dielectric layer 244 may include silicon oxide, and charge storage layer 214 and a gate layer 254 may include polysilicon.

The following sections describe the operation principle of a flash memory devices:

During a programming operation, when a first voltage is applied to gate layer 254, electrons in charge storage layer 214 enter charge trapping layer 234 through tunneling dielectric layer 224, blocking dielectric layer 225 may block electrons in charge trapping layer 234 from entering gate layer 254.

During an erase operation, a second voltage (opposite to the first voltage of the programming operation) may be applied to gate layer 254, electrons in charge trapping layer 234 enter charge storage layer 214 through tunneling dielectric layer 224.

In summary, a flash memory device and a method of manufacturing the same according to some embodiments of the present invention have been described in detail. Well-known processes, components and circuits have not been described in detail in order not to obscuring the teachings of the present invention, details The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a flash memory device, comprising:
   providing a substrate structure including a substrate, an insulating layer on the substrate, and a stack structure including a charge storage layer, a tunneling dielectric layer, a charge trapping layer, a blocking dielectric layer and a gate layer disposed sequentially from bottom to top on the insulating layer;
   performing a selective nitriding process on the substrate structure to form a nitride layer exposed surfaces of the charge storage layer and the gate layer; and
   forming an isolation region on side surfaces of the stack structure.

2. The method of claim 1, wherein performing the selective nitriding process comprises an energy of nitrogen in a range between 1.5 eV and 3.0 eV.

3. The method of claim 2, wherein the energy of nitrogen is in a range between 1.5 eV and 2.0 eV.

4. The method of claim 1, wherein performing the selective nitriding process comprises a nitrogen dose in a range between $1 \times 10^{15}$ atoms/cm$^2$ and $1 \times 10^{16}$ atoms/cm$^2$.

5. The method of claim 1, wherein performing the selective nitriding process comprises a pressure in a range between 0.1 torr and 10 torr.

6. The method of claim 1, wherein forming the isolation region comprises:
   forming a repair oxide layer on the side surfaces of the stack structure;
   forming an isolation material layer on the repair oxide layer.

7. The method of claim 6, further comprising, prior to forming the isolation material layer on the repair oxide layer:
   forming a barrier oxide layer on the repair oxide layer, and the isolation material layer being formed on the barrier oxide layer.

8. The method of claim 6, wherein forming the repair oxide layer comprises a rapid thermal oxidation process.

9. The method of claim 6, wherein forming the isolation material layer comprises a rapid thermal oxidation process, a furnace oxidation process, a chemical vapor deposition process, or an atomic layer deposition process.

10. The method of claim 1, wherein providing the substrate structure comprises:
    providing the substrate;
    forming the insulating layer on the substrate;
    forming the charge storage layer on the insulating layer;
    forming the tunneling dielectric layer on the charge storage layer;
    forming the charge trapping layer on the tunneling dielectric layer;
    forming the blocking dielectric layer on the charge trapping layer; and
    forming the gate layer on the blocking dielectric layer.

11. The method of claim 1, wherein:
    the tunneling dielectric layer comprises silicon oxide;
    the charge trapping layer comprises silicon nitride; or
    the blocking dielectric layer comprises silicon oxide; or
    the charge storage layer and the gate layer each comprise polysilicon.

12. A flash memory device, comprising:
    a substrate;
    an insulating layer on the substrate;
    a stack structure including a charge storage layer, a tunneling dielectric layer, a charge trapping layer, a blocking dielectric layer and a gate layer disposed sequentially from bottom to top on the insulating layer;
    an isolation region on side surfaces of the stack structure; and
    a nitride layer disposed between a portion of the isolation region and the charge storage layer and between a portion of the isolation region and the gate layer.

13. The flash memory device of claim 12, wherein the isolation region comprises:
    a repair oxide layer on a side surface of the stack structure; and
    an insulating material layer on the repair oxide layer.

14. The flash memory device of claim 13, wherein the isolation region further comprises:
    a barrier oxide layer between the repair oxide layer and the insulating material layer.

15. The flash memory device of claim 12, wherein:
    the tunneling dielectric layer comprises silicon oxide;
    the charge trapping layer comprises silicon nitride; or
    the blocking dielectric layer comprises silicon oxide; or the charge storage layer and the gate layer each comprise polysilicon.

\* \* \* \* \*